(12) United States Patent
Asano et al.

(10) Patent No.: US 7,759,950 B2
(45) Date of Patent: Jul. 20, 2010

(54) ELECTRONIC COMPONENT DEVICE TESTING APPARATUS

(75) Inventors: Isao Asano, Hyogo (JP); Kunihiro Tan, Hyogo (JP)

(73) Assignee: Ricoh Company Ltd., Tokyo (JP)

( * ) Notice: Subject to any disclaimer, the term of this patent is extended or adjusted under 35 U.S.C. 154(b) by 600 days.

(21) Appl. No.: 11/663,605

(22) PCT Filed: Jul. 13, 2006

(86) PCT No.: PCT/JP2006/314315

§ 371 (c)(1),
(2), (4) Date: Mar. 23, 2007

(87) PCT Pub. No.: WO2007/013341

PCT Pub. Date: Feb. 1, 2007

(65) Prior Publication Data

US 2009/0201029 A1    Aug. 13, 2009

(30) Foreign Application Priority Data

Jul. 26, 2005    (JP)    ............................. 2005-216538

(51) Int. Cl.
*G01R 31/28* (2006.01)
(52) U.S. Cl. ........................ 324/754; 324/761
(58) Field of Classification Search ......... 324/754–765, 324/158.1
See application file for complete search history.

(56) References Cited

U.S. PATENT DOCUMENTS

| | | | | |
|---|---|---|---|---|
| 4,105,970 A | * | 8/1978 | Katz | .......................... 324/761 |
| 4,232,928 A | * | 11/1980 | Wickersham | ................. 439/42 |
| 5,157,325 A | * | 10/1992 | Murphy | ....................... 324/761 |
| 6,046,597 A | * | 4/2000 | Barabi | ......................... 324/755 |
| 6,541,988 B2 | * | 4/2003 | Dangelmayer et al. | ...... 324/754 |

FOREIGN PATENT DOCUMENTS

| | | |
|---|---|---|
| JP | 59-27467 | 2/1984 |
| JP | 59-180446 | 12/1984 |
| JP | 63-181956 | 11/1988 |
| JP | 5-307069 | 11/1993 |
| JP | 10-112481 | 4/1998 |
| JP | 10-160761 | 6/1998 |

(Continued)

OTHER PUBLICATIONS

Dec. 20, 2007 Korean Office Action in connection with corresponding Korean patent application No. 10-2007-7006762, with English translation thereof.

(Continued)

*Primary Examiner*—Vinh P Nguyen
(74) *Attorney, Agent, or Firm*—Cooper & Dunham LLP

(57) ABSTRACT

An electronic component device testing apparatus includes first contacts arrayed so that first ends of the first contacts positionally correspond to electrode pads arrayed on a surface of an electronic component device; base electrodes in contact with second ends of the first contacts; and one or more second contacts each being in contact with one of the first contacts at a position which is between the first end and the second end of the one of the first contacts and closer to the first end of the one of the first contacts.

11 Claims, 9 Drawing Sheets

FOREIGN PATENT DOCUMENTS

| | | |
|---|---|---|
| JP | 2000-307052 | 11/2000 |
| JP | 2001-61232 | 3/2001 |
| JP | 2002-141506 | 5/2002 |
| JP | 2002-314029 | 10/2002 |
| JP | 2005-19343 | 1/2005 |
| KR | 10-2004-0012318 | 2/2004 |

OTHER PUBLICATIONS

International Search Report (ISR) and Written Opinion (WP) in PCT/JP2006/314315.

* cited by examiner

ELECTRONIC COMPONENT DEVICE TESTING APPARATUS

TECHNICAL FIELD

This disclosure generally relates to an electronic component device testing apparatus, and more particularly relates to an electronic component device testing apparatus including multiple contacts placed in positions corresponding to the positions of multiple electrode pads on a surface of an electronic component device and used to electrically connect an electronic component device and a tester in an electrical characteristics test of an electronic component device.

BACKGROUND ART

Secondary batteries, which can be recharged repeatedly, are used as batteries for many portable information devices. Battery degradation prevention, long time power supply, miniaturization, and low cost are important factors for secondary batteries. In a conventional lithium-ion battery pack, for example, a built-in protection circuit module with a protection circuit is provided. Such a protection circuit prevents battery degradation caused by excessive heat generated by overcurrent resulting from short circuit, incorrect charging (overvoltage or reverse voltage), or any other cause.

For example, a conventional protection circuit is implemented by inserting current control transistors composed of MOS transistors in series in a charge-discharge circuit, i.e. between a secondary battery and an external connection terminal to which a battery charger or a load is connected. When abnormal charging is detected, a current control transistor for charge control is turned off to stop the charging; when an abnormal discharging is detected, a current control transistor for discharge control is turned off to stop the discharging (see, for example, patent document 1).

FIG. 8 is a circuit diagram illustrating an exemplary secondary battery protection circuit module.

In FIG. 8, a secondary battery 48 is connected between battery-side external terminals 44a and 44b, an external apparatus 50 is connected between load-side external terminals 46a and 46b, the battery-side external terminal 44a and the load-side external terminal 46a are connected by a plus-side charge-discharge circuit 52a, and the battery-side external terminal 44b and the load-side external terminal 46b are connected by a minus-side charge-discharge circuit 52b. A current control transistor 54 and a current control transistor 56 are connected in series in the charge-discharge circuit 52b. The current control transistors 54 and 56 are composed of field effect transistors.

A protection integrated circuit (IC) chip 58 is connected between the charge-discharge circuits 52a and 52b. A supply voltage terminal 58a of the protection IC chip 58 is connected via a resistance element 60 to the charge-discharge circuit 52a; a ground terminal 58b is connected to the charge-discharge circuit 52b at a point between the battery-side external terminal 44b and the current control transistor 54; and a battery-charger minus-potential input terminal 58c is connected via a resistance element 62 to the charge-discharge circuit 52b at a point between the load-side external terminal 46b and the current control transistor 56. A condenser 64 is connected between the supply voltage terminal 58a and the ground terminal 58b. An overdischarge detection output terminal 58d is connected to the gate of the current control transistor 54. An overcharge detection output terminal 58e is connected to the gate of the current control transistor 56.

A PTC element 66 is connected between the battery-side external terminal 44b and the secondary battery 48.

In a conventional protection circuit module having a protection circuit as described above, packaged components are used as semiconductor components such as the current control transistors 54 and 56 and the protection IC chip 58, and are mounted on the circuit board.

However, since a semiconductor chip and leads are connected by bonding wires in such a packaged component, the cost of such a packaged component is high. This high cost is one of the disadvantages of using packaged components. Also, since the semiconductor chips in packaged components used as the current control transistors 54 and 56 are electrically connected via bonding wires and leads to the circuit board, it is difficult to lower on-resistance.

To solve problems described above, a protection circuit module produced by using the chip on board (COB) technology has been proposed (see, for example, patent documents 2 and 3). In the COB technology, a bare chip is mounted on a circuit board and electrodes of the chip and the circuit board are electrically connected via bonding wires.

However, since gold is used as the material of bonding wires, it is still difficult to substantially reduce the cost of a protection circuit module with the COB technology. Also, since the semiconductor chips used as current control transistors in such a protection circuit module are electrically connected via bonding wires to the circuit board, it is difficult to lower on-resistance.

Another packaging technology called the flip chip packaging technology has been proposed (see, for example, patent document 4). In the flip chip packaging technology, a bare chip having multiple external connection terminals arranged on a surface is mounted on a circuit board upside down. A secondary battery protection circuit module produced by using the flip chip packaging technology has been proposed (see, for example, patent document 5). In such a secondary battery protection circuit module, semiconductor components including a protection IC chip and current control transistors are mounted on a circuit board upside down.

The flip chip packaging technology for mounting semiconductor components on a circuit board can make production costs lower than those necessary when the wire bonding technology is used. Also, the flip chip packaging technology requires a smaller mounting area for a semiconductor component. Further, with the flip chip packaging technology, it is possible to reduce the on-resistance of field effect transistors.

In an electrical characteristics test of an electronic component device such as a secondary battery protection circuit module, the electronic component device may be either on a collective circuit board where multiple electronic component devices are arrayed before being diced into separate circuit boards or on a separate circuit board cut out from such a collective circuit board.

In such an electrical characteristics test of an electronic component device, an electronic component device testing apparatus is used to electrically connect a tester for sending a test signal to the electronic component device and the electronic component device.

FIG. 9 is a cross-sectional view of an exemplary conventional electronic component device testing apparatus.

In the exemplary conventional electronic component device testing apparatus, a socket 72 for holding pogo pins 74 is attached to a base 70 such as a testing board. Multiple pogo pins 74 are arrayed in the socket 72.

Each of the pogo pins 74 includes an electronic-component-device-side pin 74a positioned at one end of the pogo pin 74 closer to an electronic component device 98 and a base-side pin 74b positioned at the other end of the pogo pin 74 closer to the base 70. The electronic-component-device-side pin 74a and the base-side pin 74b are electrically connected inside the pogo pin 74.

Base electrodes 76 are formed on the base 70 in positions corresponding to the positions of the pogo pins 74. The base electrodes 76 are connected by a wiring pattern (not shown) to connectors (not shown) for outputting electric potentials of the base electrodes 76 to the outside. The base-side pins 74b of the pogo pins 74 are in electrical contact with the base electrodes 76.

During an electrical characteristics test, the electrodes 99 of the electronic component device 98 are brought into electrical contact with the electronic-component-device-side pins 74a of the pogo pins 74. Electric power and test signals are supplied to the electrodes 99 via the base electrodes 76 and the pogo pins 74.

[Patent document 1] Japanese Patent Application Publication No. 2001-61232

[Patent document 2] Japanese Patent Application Publication No. 2002-141506 (page 2, page 4, FIGS. 2, and 3)

[Patent document 3] Japanese Patent Application Publication No. 2002-314029 (pages 2-3, FIGS. 14, and 15)

[Patent document 4] Japanese Patent Application Publication No. 10-112481

[Patent document 5] Japanese Patent Application Publication No. 2000-307052

[Patent document 6] Japanese Patent Application Publication No. 5-307069 (FIG. 4)

During an electrical characteristics test of the electronic component device 98, electric power and test signals are supplied to the electrodes 99 via the pogo pins 74 used as contacts. In the conventional electronic component device testing apparatus described above, the resistance of the pogo pins 74 has been a problem, often preventing an accurate test of the electronic component device 98.

SUMMARY

An electronic component device testing apparatus which obviates problems caused by the resistance of contacts.

In an aspect of this disclosure, there is provided an electronic component device testing apparatus that includes first contacts arrayed so that first ends of the first contacts positionally correspond to electrode pads arrayed on a surface of an electronic component device; base electrodes in contact with second ends of the first contacts; and one or more second contacts each being electrically connected to one of the first contacts at a position which is between the first end and the second end of the one of the first contacts and closer to the first end of the one of the first contacts.

Since the second contact is in contact with the first contact near the first end, electric potential near the first end of the first contact can be obtained by using the second contact instead of the base electrode.

An electronic component device to be tested may be on a collective circuit board which is not yet diced into separate circuit boards.

According to another aspect of this disclosure, an electronic component device testing apparatus may include two or more such second contacts, each of the second contacts being electrically connected to one of the first contacts. For example, one second contact may be provided for every first contact.

The first ends of the first contacts may be movable in a direction perpendicular to the surface of the electronic component device.

For the first contacts, pogo pins may be used. A pogo pin, for example, includes an elastic device such as a spiral spring made of an electrically conductive material in its cylindrical body and an electrode or electrodes on one end or both ends. Any type of contact other than pogo pins which contact can electrically connect electrode pads and base electrodes may also be used as the first contacts.

According to another aspect of this disclosure, an electronic component device testing apparatus may include multiple sets of the first contacts, the base electrodes, and the second contacts, each set corresponding to one electronic component device.

According to still another aspect of this disclosure, the second contacts being in contact with the first contacts corresponding to the same type of electrode pads of multiple electronic component devices may be electrically connected to each other across the above described sets.

A protection circuit module for a secondary battery is an example of an electronic component device to be tested.

In another aspect of this disclosure, there is provided an electronic component device testing apparatus that includes one or more second contacts each being in contact with one of the first contacts at a position which is between the first end and the second end of the first contact and closer to the first end of the first contact is provided. Therefore, electric potential near the first end of the first contact can be obtained by using the second contact instead of the base electrode. Such a configuration obviates problems caused by the resistance of the first contact.

According to an aspect of this disclosure, an electronic component device testing apparatus may include two or more second contacts, each of the second contacts being in contact with one of the first contacts. Such a configuration obviates problems caused by the resistance of the first contacts.

The first ends of the first contacts may be movable in a direction perpendicular to the surface of an electronic component device. In such a configuration, using, for example, pogo pins as the first contacts prevents damage to the electrode pads of the electronic component device and the first contacts when they are brought into contact with each other.

According to an aspect of this disclosure, an electronic component device testing apparatus may include multiple sets of the first contacts, the base electrodes, and the second contacts, each set corresponding to one electronic component device. Such a configuration enables performing electrical characteristics tests on multiple electronic component devices at a time, thereby reducing test time.

In an electronic component device testing apparatus according to an aspect of this disclosure, the second contacts being electrically connected to the first contacts corresponding to the same type of electrode pads of multiple electronic component devices may be electrically connected to each other across the above described sets. Such a configuration makes it possible to reduce the number of lines coming out from an electronic component device testing apparatus.

BEST MODE FOR CARRYING OUT THE INVENTION

Preferred embodiments of the present invention are described below with reference to accompanying drawings.

Figure 1A:
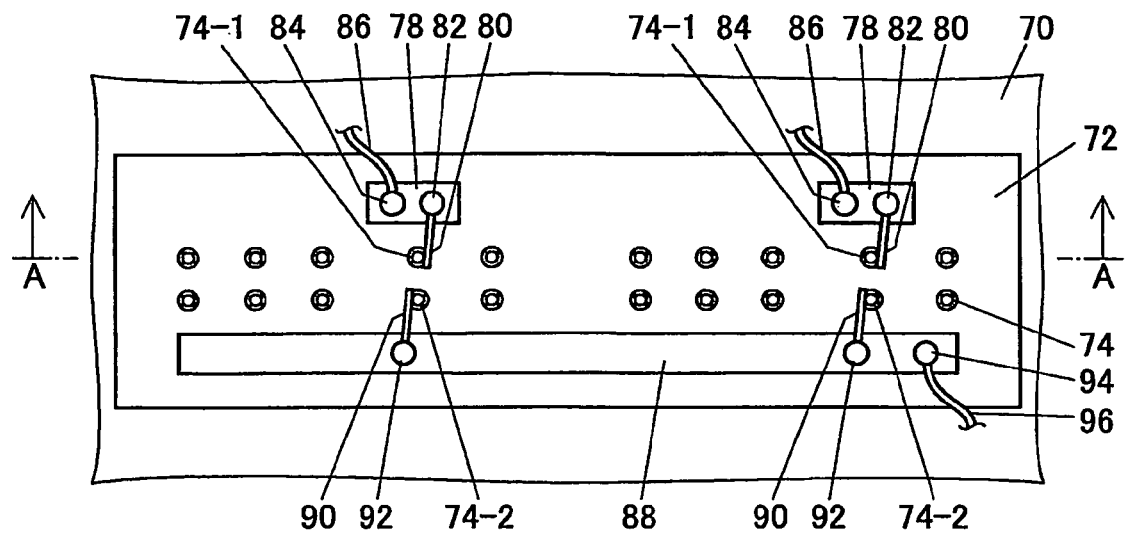
FIG. 1A is a plan view of an exemplary electronic component device testing apparatus according to an embodiment of the present invention.
Figure 1B:
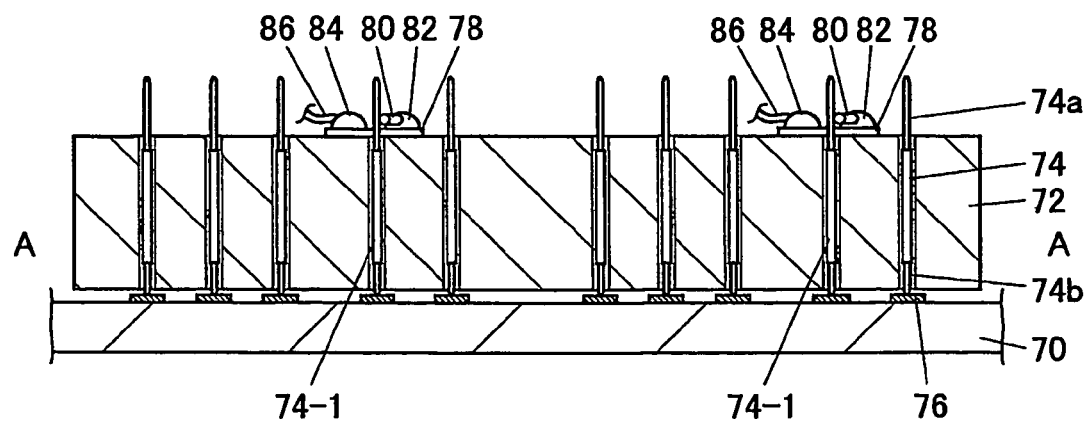
FIG. 1B is a cross-sectional view of the exemplary electronic component device testing apparatus taken along line A-A shown in FIG. 1A.

FIG. 1A is a plan view of an exemplary electronic component device testing apparatus according to an embodiment of the present invention. FIG. 1B is a cross-sectional view of the exemplary electronic component device testing apparatus taken along line A-A shown in FIG. 1A.

The exemplary electronic component device testing apparatus includes a base 70 such as a testing board. A socket 72 for holding first contacts is attached to the base 70. The socket 72 is made of an insulating material. Multiple pogo pins (first contacts) 74 (including 74-1 and 74-2) made of, for example, gold are arrayed in the socket 72. The pogo pins 74 (including 74-1 and 74-2) are placed in positions corresponding to the positions of multiple electrode pads on a surface of an electronic component device to be tested. In this embodiment, two sets of pogo pins 74 (including 74-1 and 74-2) each set corresponding to an electronic component device are provided.

Each of the pogo pins 74 (including 74-1 and 74-2) includes an electronic component device-side pin 74a positioned at one end of the pogo pin 74 closer to an electronic component device and a base-side pin 74b positioned at the other end of the pogo pin 74 closer to the base 70. The electronic component device-side pin 74a and the base-side pin 74b are electrically connected inside the pogo pin 74. An elastic part provided in each of the pogo pins 74 (including 74-1 and 74-2) allows the distance between the ends of the pins 74a and 74b to vary.

Base electrodes 76 are formed on the base 70 in positions corresponding to the positions of the pogo pins 74 (including 74-1 and 74-2). The base electrodes 76 are connected by a wiring pattern (not shown) to connectors (not shown) for outputting electric potentials of the base electrodes 76 to the outside. The base-side pins 74b of the pogo pins 74 (including 74-1 and 74-2) are in electrical contact with the base electrodes 76.

The entire length of the pogo pin 74 is, for example, 31.2 mm when extended fully. The diameter of the body of the pogo pin 74 is, for example, 0.53 mm; the length of the pin 74a is, for example, 9.0 mm; and the length of the pin 74b is, for example, 3.0 mm. The resistance of the pogo pin 74 is, for example, 40 mΩ.

A metal plate 78 made of, for example, copper foil is placed near each of the two pogo pins 74-1 on the electronic component device-side surface of the socket 72. The two pogo pins 74-1 correspond to the same type of electrode pads of two electronic component devices. A bar-like metal pin (second contact) 80 made of, for example, a gold-plated elastic material is fixed to each metal plate 78 with solder 82. The metal pin 80 is in contact with the electronic component device-side pin 74a of the pogo pin 74-1 at a position near the end of the electronic component device-side pin 74a, thereby being electrically connected to the pogo pin 74-1. A lead 86 is also connected with solder 84 to the metal plate 78. The lead 86 is connected to a connector (not shown) described above. For example, the length of the metal pin 80 is 5.0 mm and its diameter is 1.0 mm. The resistance of the metal pin 80 is, for example, 2 mΩ and is lower than that of the pogo pin 74-1.

A strip-shaped metal plate 88 made of, for example, copper foil is placed across the pogo pins 74 from the metal plates 78 on the electronic component device-side surface of the socket 72. Bar-like metal pins (second contacts) 92 made of, for example, a gold-plated elastic material are fixed to the metal plate 88 with solder 92. The two pogo pins 74-2 correspond to the same type of electrode pads of the two electronic component devices. Each metal pin 90 is in contact with the electronic component device-side pin 74a of the corresponding pogo pin 74-2 at a position near the end of the electronic component device-side pin 74a. The resistance of the metal pin 90 is lower than that of the pogo pin 74-2. The metal pins 90 are electrically connected via the solder 92 and the metal plate 88. A lead 96 is also connected with solder 94 to the metal plate 88. The lead 96 is connected to a connector (not shown) described above. For example, the length of the metal pin 90 is 5.0 mm and its diameter is 1.0 mm. The resistance of the metal pin 90 is, for example, 2 mΩ and is lower than that of the pogo pin 74-2.

As described above, the metal pins 80 and 90 are electrically connected to the corresponding pogo pins 74-1 and 74-2 at positions near the ends of the electronic component device-side pins 74a. Electric potentials of the pogo pins 74-1 and 74-2 are output not from the base electrodes 76 but from the metal pins 80 and 90 connected to the pogo pins 74-1 and 74-2. Such a configuration obviates problems caused by the resistance of the pogo pins 74-1 and 74-2 during an electrical characteristics test. The resistance of the solder 82, 84, 92, and 94 and the metal plates 78 and 88 is substantially higher than that of the pogo pins 74-1 and 74-2 and the metal pins 80 and 90, and therefore does not cause problems.

Figure 2A:
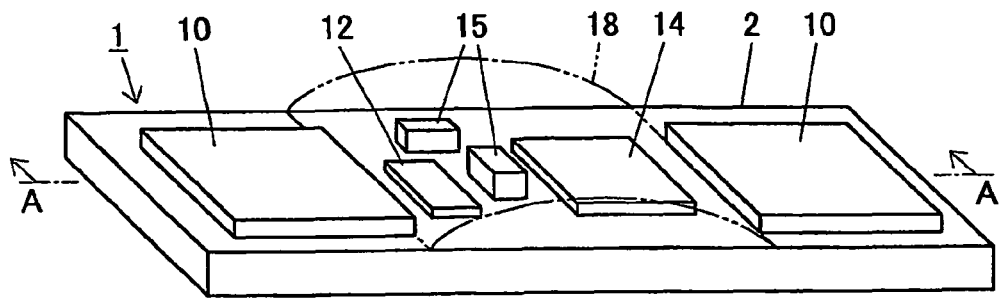
FIG. 2A is a front schematic perspective view of an exemplary protection circuit module, which is used as an example of an electronic component device on which an electrical characteristics test is performed by using an electronic component device testing apparatus according to an embodiment of the present invention.

FIG. 2A is a front schematic perspective view of an exemplary protection circuit module, which is used as an example of an electronic component device on which an electrical characteristics test is performed by using an electronic component device testing apparatus according to an embodiment of the present invention.

Figure 2B:
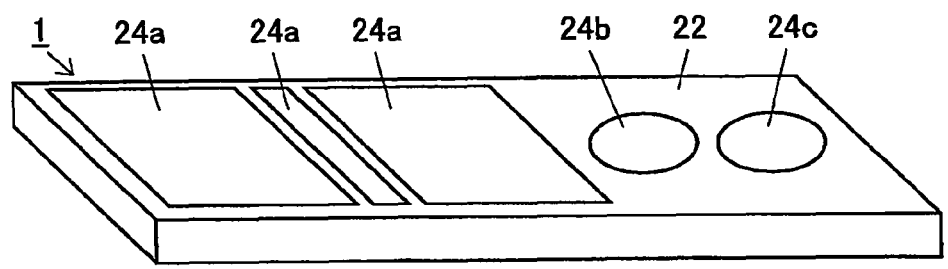
FIG. 2B is a back schematic perspective view of the exemplary protection circuit module.

FIG. 2B is a back schematic perspective view of the exemplary protection circuit module.

Figure 2C:
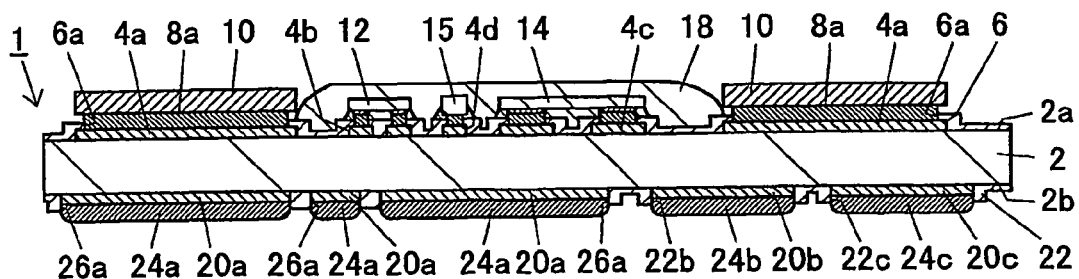
FIG. 2C is a cross-sectional view of the exemplary protection circuit module taken along line A-A shown in FIG. 2A.

FIG. 2C is a cross-sectional view of the exemplary protection circuit module taken along line A-A shown in FIG. 2A.

Figure 3A:
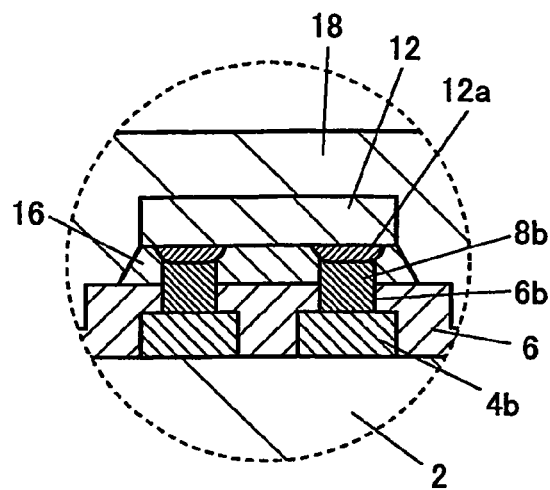
FIG. 3A is an enlarged cross-sectional view of an area including a protection IC chip mounting area.

FIG. 3A is an enlarged cross-sectional view of an area including a protection IC chip mounting area.

Figure 3B:
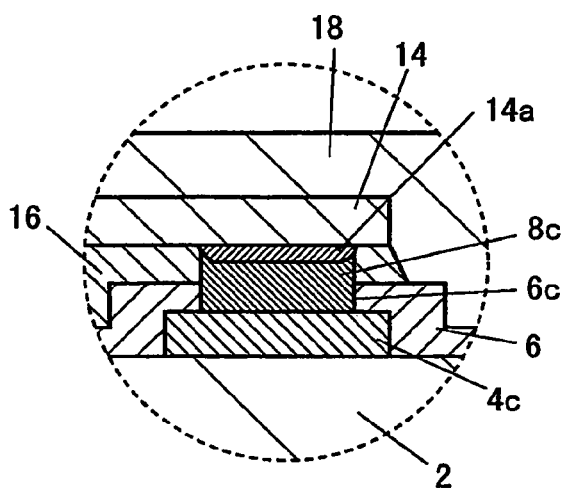
FIG. 3B is an enlarged cross-sectional view of an area including a field effect transistor chip mounting area.

FIG. 3B is an enlarged cross-sectional view of an area including a field effect transistor chip mounting area.

Figure 3C:
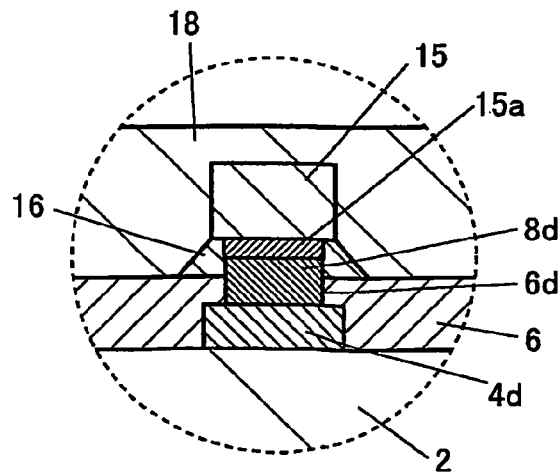
FIG. 3C is an enlarged cross-sectional view of an area including an electronic component mounting area.

FIG. 3C is an enlarged cross-sectional view of an area including an electronic component mounting area.

The exemplary protection circuit module is described below with reference to FIGS. 2A through 3C.

A protection circuit module 1 includes a circuit board 2. Two battery-side external terminals 4a, multiple protection IC chip connecting electrodes 4b, multiple field effect transistor chip connecting electrodes 4c, multiple electronic component connecting electrodes 4d, and a wiring pattern (not shown) are formed on a front side 2a of the circuit board 2 (refer to FIG. 2C). The battery-side external terminals 4a, the protection IC chip connecting electrodes 4b, the field effect transistor chip connecting electrodes 4c, the electronic component connecting electrodes 4d, and the wiring pattern are, for example, made of copper. The protection IC chip connecting electrodes 4b, the field effect transistor chip connecting electrodes 4c, and the electronic component connecting electrodes 4d are positioned between the two battery-side external terminals 4a.

An insulating material layer 6 is formed on the front side 2a of the circuit board 2. The insulating material layer 6 has openings 6a corresponding to the battery-side external terminals 4a, openings 6b (see FIG. 3A) corresponding to the protection IC chip connecting electrodes 4b, openings 6c (see FIG. 3B) corresponding to the field effect transistor chip connecting electrodes 4c, and openings 6d (see FIG. 3C) corresponding to the electronic component connecting electrodes 4d.

Nickel plates (metal plates) 10 are positioned on solder 8a formed in the openings 6a corresponding to the battery-side external terminals 4a.

A bare protection IC chip (semiconductor component) 12 is mounted upside down (using the flip chip packaging technology) on an area where the protection IC chip connecting electrodes 4b are formed. External connection terminals 12a are formed on a surface of the protection IC chip 12 mounted on the circuit board 2. The external connection terminals 12a are connected via solder 8b formed in the openings 6b to the protection IC chip connecting electrodes 4b.

A bare field effect transistor chip (semiconductor component) 14 is mounted upside down on an area where the field effect transistor chip connecting electrodes 4c are formed. External connection terminals 14a are formed on a surface of the field effect transistor chip 14 mounted on the circuit board 2. The external connection terminals 14a are connected via solder 8c formed in the openings 6c to the field effect transistor chip connecting electrodes 4c. The field effect transistor chip 14 includes, for example, two field effect transistors connected in series.

Two electronic components 15 are mounted on areas where the electronic component connecting electrodes 4d are formed. For example, a thermistor element such as a PTC element, a resistor, or a condenser may be used as an electronic component 15. The electronic components 15 mounted on the circuit board 2 include electrodes 15a. The electrodes 15a are connected via solder 8d formed in the openings 6d to the electronic component connecting electrodes 4d.

The external connection terminals 12a of the protection IC chip 12 and the external connection terminals 14a of the field effect transistor chip 14 are, for example, formed by electroless plating.

The space between the protection IC chip 12 and the insulating material layer 6 and the space between the field effect transistor chip 14 and the insulating material layer 6 are filled with underfilling 16 made of a resin material. The underfilling 16 is, for example, made of epoxy resin or silicon resin. The material for the underfilling 16 may or may not include silica particles.

The space between the electronic components 15 and the insulating material layer 6 and the space around the solders 8d for mounting the electronic components 15 are filled with fillet-shaped (tapered) structures made of the underfilling 16.

Sealing resin 18 is formed on the insulating material layer 6 between the two nickel plates 10, covering the protection IC chip 12 mounting area, the field effect transistor chip 14 mounting area, and the electronic component 15 mounting areas. The protection IC chip 12, the field effect transistor chip 14, and the electronic components 15 are covered and protected by the sealing resin 18.

For example, three load-side external terminals 20a, a test terminal 20b, and a test terminal 20c are formed on a back side 2b (the side opposite the front side 2a) of the circuit board 2. The load-side external terminals 20a, the test terminal 20b, and the test terminal 20c are, for example, made of copper.

An insulating material layer 22 is formed on the back side 2b of the circuit board 2. The insulating material layer 22 has openings 22a corresponding to the load-side external terminals 20a, and openings 22b and 22c corresponding to the test terminals 20b and 20c, respectively.

Gold-plate layers 24a are formed on the load-side external terminals 20a, and gold-plate layers 24b and 24c are formed on the test terminals 20b and 20c, respectively.

In this exemplary protection circuit module, the battery-side external terminals 4a are positioned on the front side 2a of the circuit board 2, and the load-side external terminals 20a are positioned on the back side 2b of the circuit board 2. Compared with a configuration where the battery-side external terminals 4a and the load-side external terminals 20a are positioned on the same side of the circuit board 2, the above configuration makes it possible to reduce the size of the circuit board 2 and thereby to reduce the size of the protection circuit module 1.

The protection IC chip 12 and the field effect transistor chip 14 are mounted on the front side 2a of the circuit board 2 by using the flip chip packaging technology. The flip chip packaging technology can make production costs lower than those necessary when the wire bonding technology is used. Also, the flip chip packaging technology requires smaller mounting areas for the protection IC chip 12 and the field effect transistor chip 14.

Further, with the flip chip packaging technology, it is possible to reduce the on-resistance of the field effect transistor chip 14.

Also, in the protection circuit module 1, the protection IC chip 12, the field effect transistor chip 14, and the electronic components 15 are covered and protected by the sealing resin 18.

The insulating material layer 6 formed on the front side 2a of the circuit board 2 has the openings 6a corresponding to the battery-side external terminals 4a, the openings 6b corresponding to the protection IC chip connecting electrodes 4b, and the openings 6c corresponding to the field effect transistor chip connecting electrodes 4c. The external connection terminals 12a of the protection IC chip 12 are connected via the solder 8b formed in the openings 6b to the protection IC chip connecting electrodes 4b. The external connection terminals 14a of the field effect transistor chip 14 are connected via the solder 8c formed in the openings 6c to the field effect transistor chip connecting electrodes 4c. In other words, the insulating material layer 6 is formed between the adjoining external connection terminals 12a of the protection IC chip 12 and between the adjoining external connection terminals 14a of the field effect transistor chip 14. Thus, the insulating material layer 6 prevents short circuits between the adjoining external connection terminals 12a and between the adjoining external connection terminals 14a.

The gold-plate layers 24a formed on the load-side external terminals 20a provide stable electrical connection between the terminals of a load such as a portable device or a battery charger and the load-side external terminals 20a. The gold-plate layers 24b and 24c formed on the test terminals 20b and 20c provide stable electrical connection during a test.

The space between the electronic components 15 and the insulating material layer 6 and the space around the solder 8d for mounting the electronic components 15 are filled with fillet-shaped structures made of the underfilling 16. These structures prevent the entry of tiny air bubbles into the sealing resin 18 around the electronic components 15, thereby preventing defective appearance caused by such air bubbles and reliability problems caused by a void formed when the air bubbles are expanded by heat.

However, the underfilling 16 around the electronic components 15 may be omitted.

This exemplary protection circuit module includes one protection IC chip 12 and one field effect transistor chip 14 as semiconductor components. However, the configuration of a protection circuit module is not limited to the configuration described in this embodiment and a protection circuit module may include any number and type of semiconductor components. For example, a protection circuit module may include one protection IC chip and two field effect transistor chips. Also, a protection circuit module may include any number and type of electronic components 15.

This exemplary protection circuit module includes three load-side external terminals 20a. However, the configuration of a protection circuit module is not limited to the configuration described in this embodiment and a protection circuit module may include any number of load-side external terminals. For example, a protection circuit module may include two load-side external terminals or include four load-side external terminals.

Figure 4A:
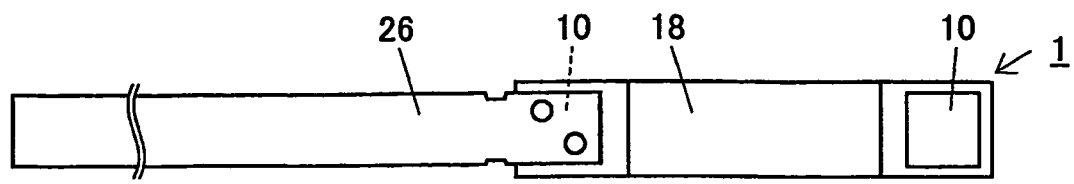
FIG. 4A is a front plan view of an exemplary protection circuit module with a wiring part for electrically connecting a secondary battery and a battery-side external terminal attached.
Figure 4B:
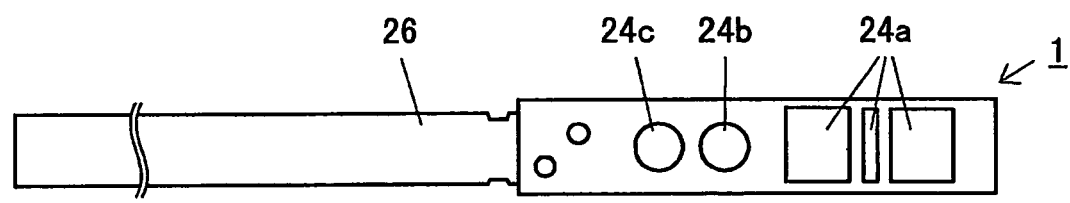
FIG. 4B is a back plan view of the exemplary protection circuit module.

FIG. 4A is a front plan view of an exemplary protection circuit module with a wiring part for electrically connecting a secondary battery and a battery-side external terminal attached. FIG. 4B is a back plan view of the exemplary protection circuit module. In FIG. 4, the same reference numbers are used for parts corresponding to those shown in FIG. 2, and description of those parts are omitted.

A strip-shaped nickel wiring part 26 for electrically connecting a secondary battery and a battery-side external terminal 4a of the protection circuit module 1 is spot-welded to one of the two nickel plates 10 on the front side 2a of the protection circuit module 1.

Figure 5:
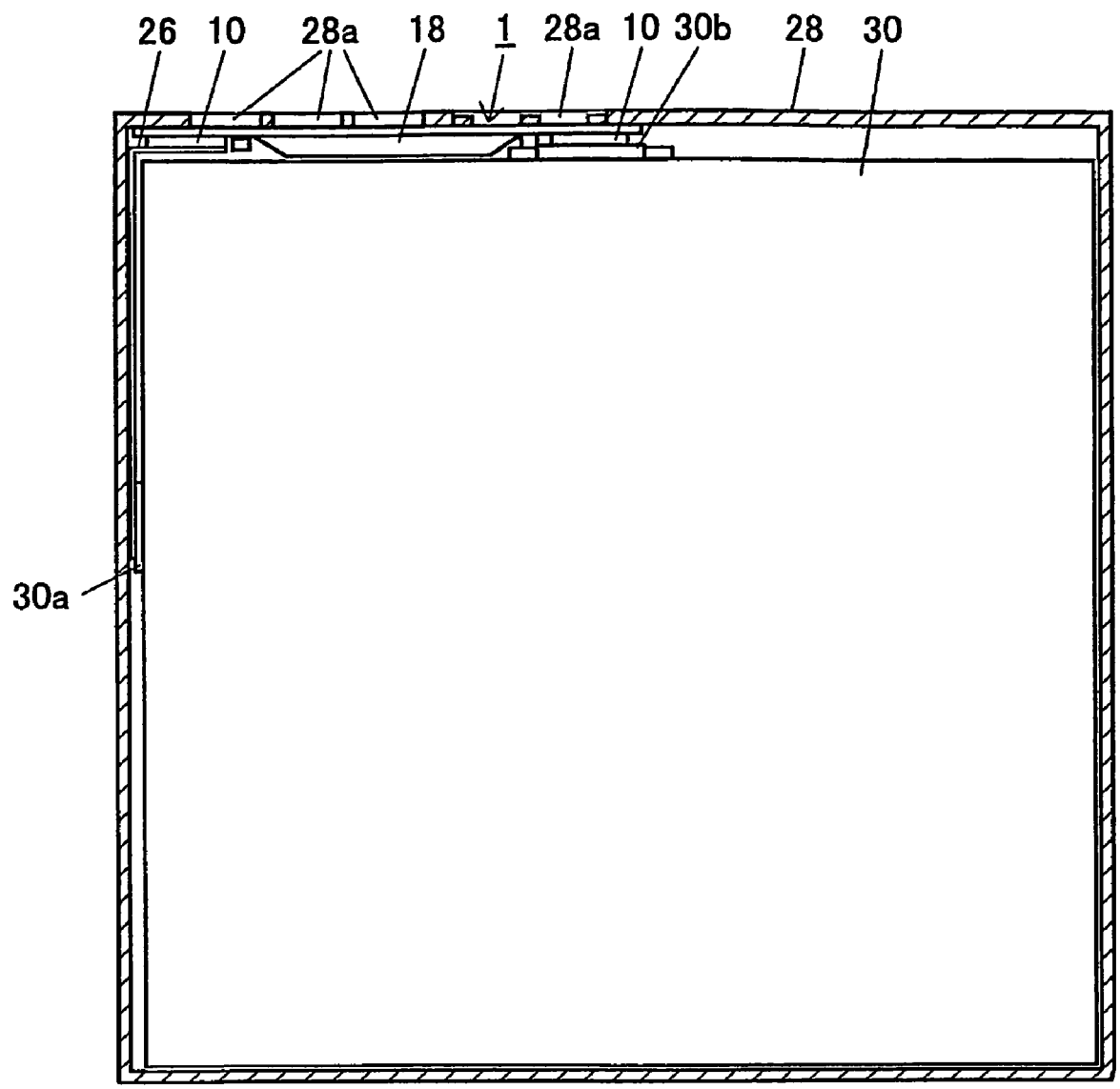
FIG. 5 is a plan view of an exemplary battery pack including a cross section of a part of the battery pack.

FIG. 5 is a plan view of an exemplary battery pack including a cross section of a part of the battery pack.

The exemplary battery pack includes a case 28 made of an insulating material. The protection circuit module 1, a secondary battery 30, and the nickel wiring part 26 are arranged in the case 28. The protection circuit module 1 is positioned so that the back side 2b faces outward and the front side 2a faces inward. The gold-plate layers 24a, 24b, and 24c are formed on the load-side external terminals 20a and the test terminals 20b and 20c on the back side 2b. The nickel plates 10 and the sealing resin 18 are formed on the front side 2a. The case 28 has openings 28a corresponding to the gold-plate layers 24a, 24b, and 24c.

The nickel wiring part 26 spot-welded to one of the two nickel plates 10 is connected to an electrode 30a of the secondary battery 30. The other nickel plate 10 is connected to an electrode 30b of the secondary battery 30.

The exemplary configuration of the protection circuit module 1 described above makes it possible to reduce the size and production cost of a protection circuit module, thereby making it possible to reduce the size and production cost of a battery pack.

In this exemplary battery pack, one of the two nickel plates 10 is directly connected to the electrode 30b of the secondary battery 30. However, the configuration of a battery pack is not limited to the configuration described above and the two nickel plates 10 may be connected via nickel wiring parts to the electrodes 30a and 30b of the secondary battery 30.

Figure 6A:
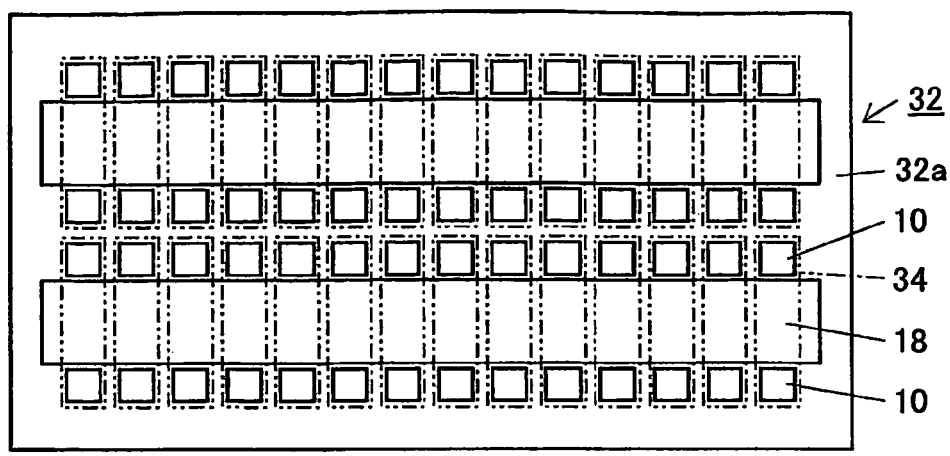
FIG. 6A is a front plan view of an exemplary collective circuit board to be tested.
Figure 6B:
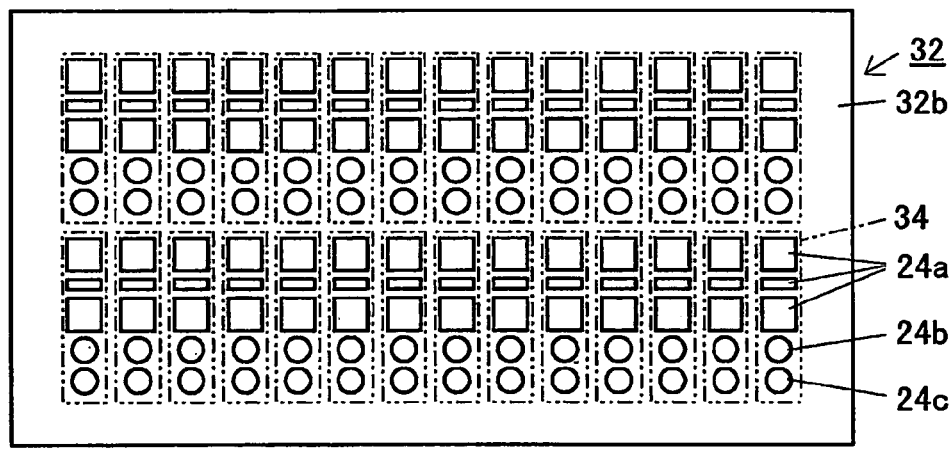
FIG. 6B is a back plan view of the exemplary collective circuit board.

FIG. 6A is a front plan view of an exemplary collective circuit board to be tested. FIG. 6B is a back plan view of the exemplary collective circuit board. In FIG. 6, the same reference numbers are used for parts corresponding to those shown in FIG. 2, and description of those parts are omitted.

Multiple electronic component device areas 34 before being diced into separate circuit boards are arrayed on a collective circuit board 32. The planar shape of each electronic component device area 34 is rectangular. On the collective circuit board 32, two electronic component device areas 34 are arrayed in the longitudinal direction and 14 electronic component device areas 34 are arrayed in the horizontal direction.

Two nickel plates 10 are placed on each of the electronic component device areas 34 on a front side 32a of the collective circuit board 32. The sealing resin 18 is formed continuously on each row of the electronic component device areas 34 in the horizontal direction.

On the back side 32b of the collective circuit board 32, gold-plate layers 24a, 24b, and 24c are formed on each of the electronic component device area 34.

Figure 7:
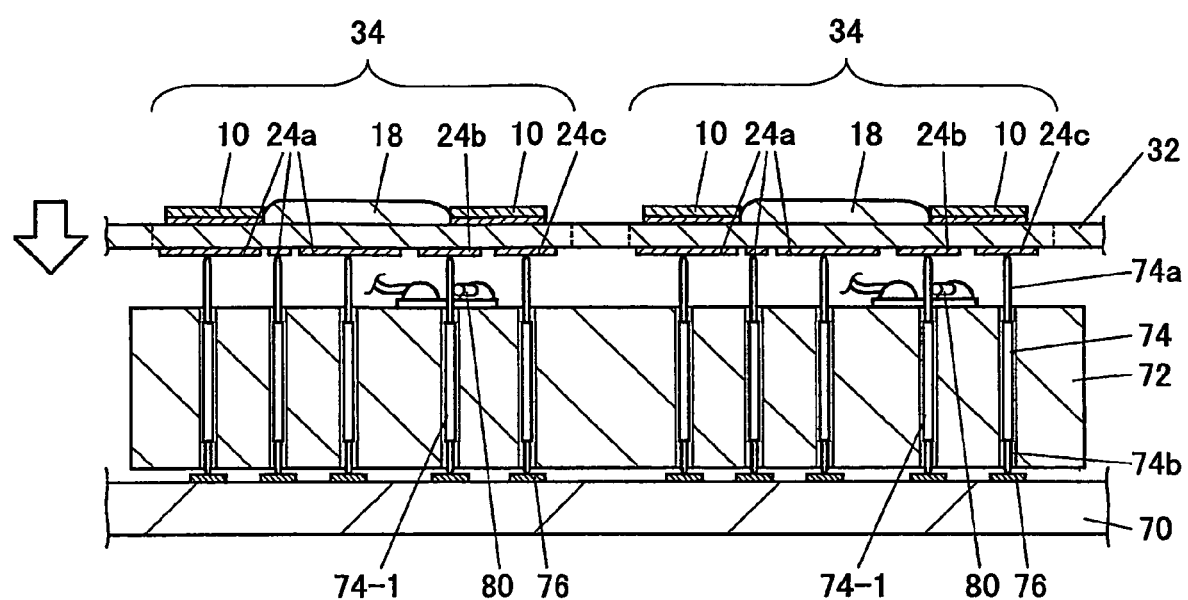
FIG. 7 is a cross-sectional view of the electronic component device testing apparatus shown in FIG. 1 and the exemplary collective circuit board shown in FIG. 6 being tested by the electronic component device testing apparatus.
Figure 8:
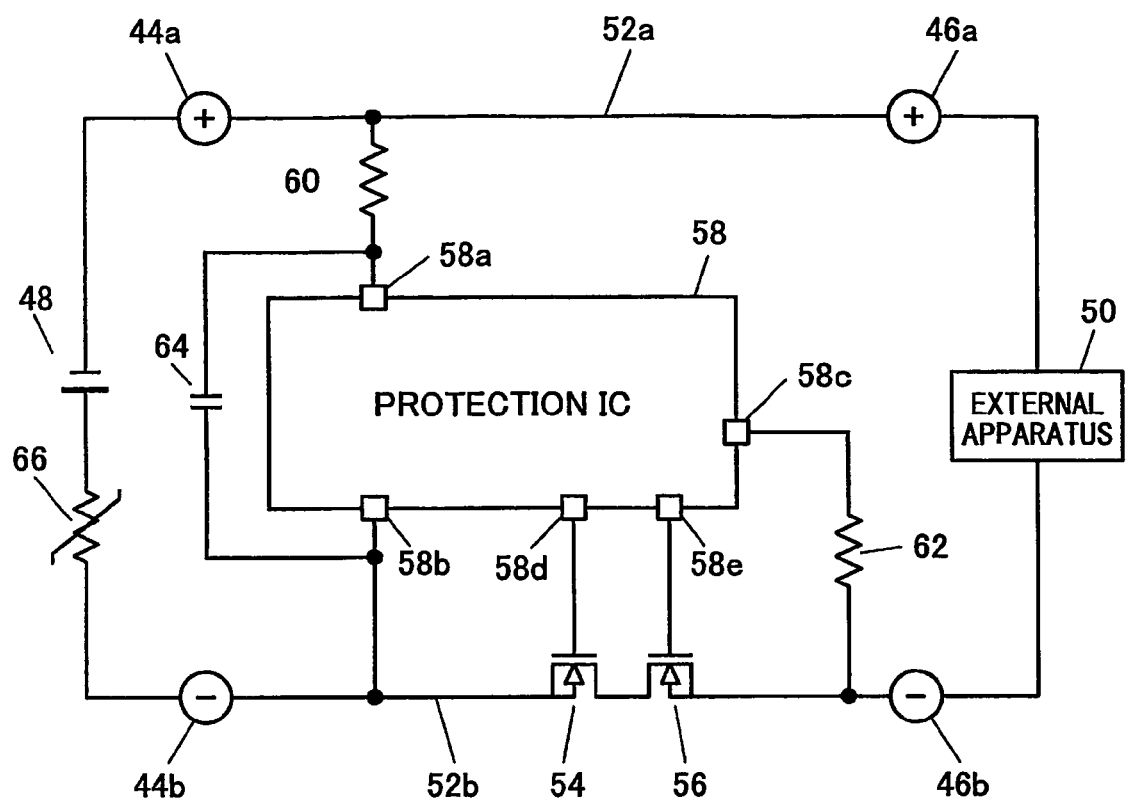
FIG. 8 is a circuit diagram illustrating an exemplary secondary battery protection circuit module.
Figure 9:
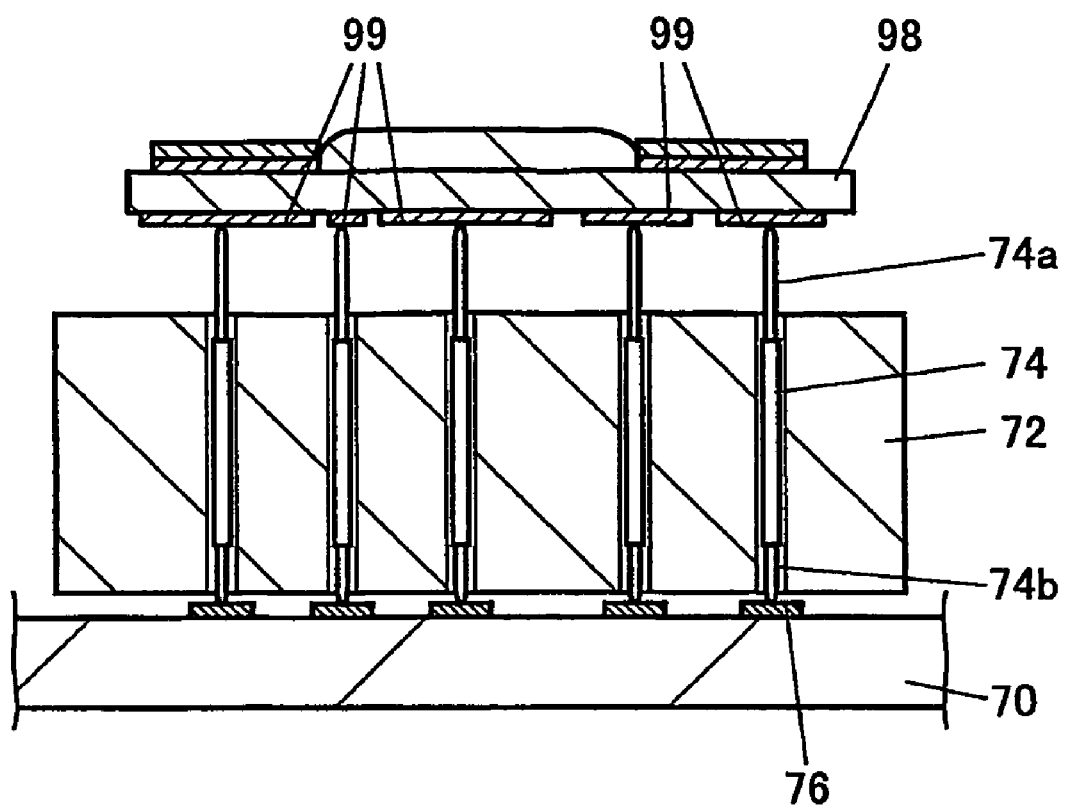
FIG. 9 is a cross-sectional view of an exemplary conventional electronic component device testing apparatus.

FIG. 7 is a cross-sectional view of the electronic component device testing apparatus shown in FIG. 1 and the exemplary collective circuit board 32m, shown in FIG. 6, being tested by the electronic component device testing apparatus.

The collective circuit board 32 is aligned and positioned over the electronic component device testing apparatus and moved down so that the pogo pins 74 (including 74-1 and 74-2) come in contact with the gold-plate layers 24a, 24b, and 24c. Electric power and test signals are supplied to the gold-plate layers 24a, 24b, and 24c via the pogo pins 74 (including 74-1 and 74-2). Electric power and test signals to the gold-plate layer 24b are provided not from the base electrodes 76 but through the leads 86 and 96, the solder 84 and 94, the metal plates 78 and 88, the solder 82 and 92, and the metal pins 80 and 90. Such a configuration obviates problems caused by the resistance of the pogo pins 74-1 and 74-2, thereby improving the test accuracy.

Although pogo pins are used as first contacts in the exemplary electronic component device testing apparatus shown in FIG. 1, other types of contacts may also be used.

Although bar-like metal pins 80 and 90 are used as second contacts in this embodiment, contacts of any type and material having substantially low resistance may be used as second contacts.

In this embodiment, the metal pins 80 and 90 are fixed to the socket 72 and are in contact with the pogo pins 74-1 and 74-2 so that the electronic component device-side pins 74a of the pogo pins 74-1 and 74-2 can move. However, the present invention is not limited to this embodiment and the metal pins 80 and 90 may be soldered to the electronic component device-side pins 74a of the pogo pins 74-1 and 74-2 so that the electronic component device-side pins 74a and the metal pins 80 and 90 move together. Such a configuration makes it possible to reduce the contact resistance between the pogo pins 74-1 and 74-2 and the metal pins 80 and 90.

Also, although the metal pins 80 and 90 are provided only for the pogo pins 74-1 and 74-2 in this embodiment, metal pins (second contacts) may be provided for any number of pogo pins (first contacts). For example, second contacts may be provided for all first contacts.

In this embodiment, two sets of pogo pins 74 (including 74-1 and 74-2) are provided so that two electronic component device areas 34 can be tested at a time. However, an electronic component device testing apparatus according to the present invention may be configured to test one electronic component device area or more than two electronic component device areas at a time.

An electronic component device testing apparatus according to the present invention can also be used to test an electronic component device on a separate circuit board cut out from a collective circuit board.

In this embodiment, a protection circuit module is used as an example of an electronic component device to be tested. However, an electronic component device testing apparatus according to the present invention may be used for testing other types of electronic component devices.

The present invention is not limited to the specifically disclosed embodiments, and variations and modifications may be made without departing from the scope of the present invention.

The present application is based on Japanese Priority Application No. 2005-216538, filed on Jul. 26, 2005, the entire contents of which are hereby incorporated herein by reference.

The invention claimed is:

1. An electronic component device testing apparatus for testing an electronic component device, comprising:
    first contacts arrayed so that first ends of the first contacts positionally correspond to electrode pads arrayed on a surface of the electronic component device;
    base electrodes in contact with second ends of the first contacts; and
    at least one second contact comprising a metal pin that is in direct electrical contact with a corresponding one of the first contacts at a position which is between the first end and the second end of the one of the first contacts and closer to the first end of the one of the first contact, wherein the second contact transmits at least one of electrical power and electrical test signals to one of the electrode pads on the surface of the electronic component device, via the first end of the corresponding first contact and not via the second end of the corresponding first contact.

2. The electronic component device testing apparatus as claimed in claim 1, wherein two or more of the second contacts are provided, each of the second contacts being electrically connected to one of the first contacts.

3. The electronic component device testing apparatus as claimed in claim 1, wherein the first ends of the first contacts are movable in a direction perpendicular to the surface of the electronic component device.

4. The electronic component device testing apparatus as claimed in claim 1, wherein the first contacts comprise a cylindrical body, an elastic device made of an electrically conductive material in the cylindrical body, and electrodes at ends of the cylindrical body interconnected by the elastic device.

5. The electronic component device testing apparatus as claimed in claim 1, wherein a plurality of sets of the first contacts, the base electrodes, and said one or more second contacts is provided, each set corresponding to one electronic component device.

6. The electronic component device testing apparatus as claimed in claim 5, wherein the second contacts in contact with the first contacts corresponding to a same type of the electrode pads of the electronic component devices are electrically connected to each other across said sets.

7. The electronic component device testing apparatus as claimed in claim 1, wherein the electronic component device is a protection circuit module for a secondary battery.

8. The electronic component device testing apparatus as claimed in claim 1, wherein the second contact further comprises a metal plate assembly attached to the metal pin.

9. The electronic component device testing apparatus as claimed in claim 8, wherein the metal plate assembly of the second contact is placed in close proximity to the first end of the corresponding first contact, and the metal pin attached to the metal plate assembly is in direct electrical contact with the first end of the first contact.

10. The electronic component device testing apparatus as claimed in claim 8,
    wherein one end of a lead is connected to the metal plate assembly of the second contact and another end of the lead is connected by a wiring pattern to a connector, and
    wherein at least one of electrical power and electrical test signals are transmitted from the connector to one of the electrode pads, via the lead, the metal plate assembly of the second contact, the metal pin of the second contact, and the first end of the corresponding first contact.

11. The electronic component device testing apparatus as claimed in claim 1, wherein a resistance of the metal pin of the second contact is less than a resistance of the corresponding first contact.

* * * * *